(12) United States Patent
Frey et al.

(10) Patent No.: US 11,748,964 B2
(45) Date of Patent: Sep. 5, 2023

(54) METHOD FOR DETERMINING AT LEAST ONE REGION IN AT LEAST ONE INPUT MODEL FOR AT LEAST ONE ELEMENT TO BE PLACED

(71) Applicant: SIEMENS SCHWEIZ AG, Zurich (CH)

(72) Inventors: Christian Frey, Unterägeri (CH); Wolfram Klein, Neubiberg (DE); Hermann Georg Mayer, Prien am Chiemsee (DE)

(73) Assignee: SIEMENS SCHWEIZ AG, Zurich (CH)

( * ) Notice: Subject to any disclaimer, the term of this patent is extended or adjusted under 35 U.S.C. 154(b) by 0 days.

(21) Appl. No.: 16/653,362

(22) Filed: Oct. 15, 2019

(65) Prior Publication Data

US 2020/0126317 A1 Apr. 23, 2020

(30) Foreign Application Priority Data

Oct. 17, 2018 (EP) .................................... 18200985

(51) Int. Cl.
*G06T 19/20* (2011.01)
*G06F 30/13* (2020.01)

(52) U.S. Cl.
CPC .............. *G06T 19/20* (2013.01); *G06F 30/13* (2020.01); *G06T 2200/24* (2013.01); *G06T 2210/04* (2013.01); *G06T 2219/2004* (2013.01)

(58) Field of Classification Search
CPC . G06T 19/20; G06T 2200/24; G06T 2210/04; G06T 2207/20221; G06T 2200/04; G06T 2219/2004; G06T 19/006; G06T 7/001; G06F 30/13; G06F 2111/08; G06F 2111/04; H04N 13/156; H04N 13/344; G02B 27/017; G02B 27/0172;
(Continued)

(56) References Cited

U.S. PATENT DOCUMENTS 5,101,436 A * 3/1992 DeAguiar ............... G06T 17/00
382/241
5,444,836 A * 8/1995 Hollingsworth ........ G06T 19/00
706/919
(Continued)

FOREIGN PATENT DOCUMENTS

WO 2020055649 A1 3/2020

OTHER PUBLICATIONS

Siraj D Shan: "JudgeMaster: Automated chess movement validator"; 2017 National Information Technology Conference (NITC); Sep. 14, 2017.

*Primary Examiner* — Charles L Beard
(74) *Attorney, Agent, or Firm* — Schmeiser, Olsen & Watts LLP

(57) ABSTRACT

Provided is a method for determining at least one region in at least one input model for at least one element to be placed including the steps: receiving an input data set including the at least one element to be placed, a plurality of conditions; the at least one input model; determining at least one appurtenant condition from the plurality of conditions; and determining at least one valid and/or invalid region of the at least one input model depending on the appurtenant condition; wherein the at least one valid region satisfies the appurtenant condition at least in part.

14 Claims, 2 Drawing Sheets

(58) Field of Classification Search
CPC .......... G02B 19/003; G02B 2027/0134; G02B 2027/0138; G02B 2027/014; G02B 2027/0141; G02B 2027/0178; G02B 2027/0187; G06Q 10/06; G06Q 50/163; G08B 17/00; G08B 29/00; G08B 29/18; G08B 7/066
See application file for complete search history.

(56) References Cited

U.S. PATENT DOCUMENTS

| | | | | |
|---|---|---|---|---|
| 6,016,147 | A * | 1/2000 | Gantt | G06T 19/20 345/419 |
| 6,323,859 | B1 * | 11/2001 | Gantt | G06T 19/20 345/419 |
| 6,377,263 | B1 * | 4/2002 | Falacara | G06N 3/006 345/473 |
| 6,972,676 | B1 * | 12/2005 | Kimmel | G08B 13/19608 340/520 |
| 7,043,695 | B2 * | 5/2006 | Elber | G06T 17/00 715/767 |
| 7,062,722 | B1 * | 6/2006 | Carlin | G06T 15/10 715/848 |
| 7,277,572 | B2 * | 10/2007 | MacInnes | G06F 30/13 382/284 |
| 7,425,958 | B2 * | 9/2008 | Berger | G06T 15/20 715/764 |
| 7,479,959 | B2 * | 1/2009 | Han | G06T 19/00 345/420 |
| 8,254,668 | B2 * | 8/2012 | Mashitani | H04N 13/296 382/154 |
| 8,762,877 | B2 * | 6/2014 | Loberg | G06N 5/02 715/764 |
| 9,092,053 | B2 * | 7/2015 | Kerr | G06F 3/0304 |
| 9,398,413 | B1 * | 7/2016 | Scalise | H04N 21/00 |
| 9,557,566 | B2 * | 1/2017 | Fujimaki | G02B 27/017 |
| 9,679,038 | B2 * | 6/2017 | Omansky | G06F 30/13 |
| 9,767,612 | B2 * | 9/2017 | Bhuruth | G06T 19/20 |
| 10,319,150 | B1 * | 6/2019 | Canada | G06T 19/006 |
| 10,339,721 | B1 * | 7/2019 | Dascola | G06F 3/0485 |
| 10,410,419 | B2 * | 9/2019 | Rueb | H04N 9/3185 |
| 10,460,529 | B2 * | 10/2019 | Dascola | G06F 1/1694 |
| 10,475,250 | B1 * | 11/2019 | Huang | G06Q 30/0643 |
| 10,475,253 | B2 * | 11/2019 | Yerkes | G06F 1/1686 |
| 10,636,185 | B2 * | 4/2020 | Wu | G01C 21/20 |
| 10,740,960 | B2 * | 8/2020 | Stachniak | G06F 3/011 |
| 10,803,666 | B1 * | 10/2020 | Buerli | G06F 3/011 |
| 10,867,080 | B2 * | 12/2020 | Jovanovic | G06T 19/006 |
| 10,917,613 | B1 * | 2/2021 | Chiarella | H04N 7/157 |
| 11,010,965 | B2 * | 5/2021 | Stachniak | G06T 19/20 |
| 11,029,671 | B1 * | 6/2021 | Guglielmo | G06F 3/14 |
| 11,049,329 | B2 * | 6/2021 | Shen | H04W 4/029 |
| 11,099,707 | B2 * | 8/2021 | Rockel | G06F 3/011 |
| 11,164,002 | B2 * | 11/2021 | Lee | G06F 18/285 |
| 11,195,342 | B2 * | 12/2021 | Stansell | G06T 19/006 |
| 11,232,703 | B1 * | 1/2022 | Wolf | H04L 63/0876 |
| 11,252,329 | B1 * | 2/2022 | Cier | H04N 23/53 |
| 11,270,034 | B1 * | 3/2022 | Shen | G06N 7/01 |
| 2003/0029464 | A1 * | 2/2003 | Chen | A61B 90/36 600/429 |
| 2003/0149500 | A1 * | 8/2003 | Faruque | G06T 19/20 700/97 |
| 2004/0021664 | A1 * | 2/2004 | Takemoto | G06T 19/20 382/154 |
| 2005/0188348 | A1 * | 8/2005 | Han | G06T 17/10 717/113 |
| 2007/0008099 | A1 * | 1/2007 | Kimmel | G08B 25/14 340/506 |
| 2007/0198231 | A1 * | 8/2007 | Walch | G06F 30/13 703/1 |
| 2007/0265741 | A1 * | 11/2007 | Oi | G01C 21/12 701/23 |
| 2009/0113349 | A1 * | 4/2009 | Zohar | G06Q 30/00 715/852 |
| 2010/0198563 | A1 * | 8/2010 | Plewe | G06F 30/17 703/1 |
| 2010/0208057 | A1 * | 8/2010 | Meier | G06T 15/00 345/173 |
| 2010/0217565 | A1 * | 8/2010 | Wayne | G06F 30/13 706/54 |
| 2010/0217566 | A1 * | 8/2010 | Wayne | G06F 30/13 703/1 |
| 2010/0217639 | A1 * | 8/2010 | Wayne | G06F 30/13 715/810 |
| 2010/0289817 | A1 * | 11/2010 | Meier | G06T 15/20 345/619 |
| 2010/0305941 | A1 * | 12/2010 | Hogan | G06F 40/20 704/9 |
| 2010/0306681 | A1 * | 12/2010 | Loberg | G06F 30/13 715/764 |
| 2011/0213480 | A1 * | 9/2011 | Zila | G06F 30/13 700/98 |
| 2011/0268325 | A1 * | 11/2011 | Teichman | G06T 19/006 382/128 |
| 2012/0063670 | A1 * | 3/2012 | Woo | H04N 13/128 382/154 |
| 2012/0075343 | A1 * | 3/2012 | Chen | G06T 7/73 345/633 |
| 2012/0120113 | A1 * | 5/2012 | Hueso | G06F 3/011 345/672 |
| 2012/0183204 | A1 * | 7/2012 | Aarts | G06T 15/205 382/154 |
| 2012/0296611 | A1 * | 11/2012 | Teller | G06F 30/13 703/1 |
| 2013/0046523 | A1 * | 2/2013 | Van Dinther | G09B 23/285 703/6 |
| 2013/0072784 | A1 * | 3/2013 | Velusamy | A61B 6/5294 600/424 |
| 2013/0187905 | A1 * | 7/2013 | Vaddadi | G06T 19/006 345/419 |
| 2013/0342571 | A1 * | 12/2013 | Kinnebrew | G06F 3/147 345/633 |
| 2014/0032179 | A1 * | 1/2014 | Solihin | G06F 30/18 703/1 |
| 2014/0074272 | A1 * | 3/2014 | Cowden, IV | G06F 30/00 700/97 |
| 2014/0104274 | A1 * | 4/2014 | Hilliges | G06T 19/20 345/424 |
| 2014/0134580 | A1 * | 5/2014 | Becker | G09B 9/00 434/234 |
| 2014/0149081 | A1 * | 5/2014 | Hinners | G06F 30/13 703/1 |
| 2014/0152660 | A1 * | 6/2014 | Lee | G06T 19/20 345/420 |
| 2014/0240349 | A1 * | 8/2014 | Tuukkanen | G06F 3/0484 345/633 |
| 2014/0320282 | A1 * | 10/2014 | Zhang | G08B 7/066 340/502 |
| 2014/0378022 | A1 * | 12/2014 | Muthyala | A63H 33/06 446/91 |
| 2015/0022522 | A1 * | 1/2015 | Li | G06T 19/00 345/424 |
| 2015/0178992 | A1 * | 6/2015 | Bhuruth | G06T 19/006 345/633 |
| 2015/0213649 | A1 * | 7/2015 | Morishita | H04N 13/239 345/419 |
| 2015/0238271 | A1 * | 8/2015 | Wollowick | A61B 6/12 600/436 |
| 2015/0243071 | A1 * | 8/2015 | Jovanovic | G06Q 50/01 345/427 |
| 2015/0253766 | A1 * | 9/2015 | Pettersson | G05B 19/41805 700/168 |
| 2015/0310136 | A1 * | 10/2015 | Maletz | G06F 30/13 703/1 |
| 2015/0332511 | A1 * | 11/2015 | Jovanovic | G06F 3/04815 345/427 |
| 2016/0061579 | A1 * | 3/2016 | Tsujimoto | G01B 21/047 702/155 |
| 2016/0078682 | A1 * | 3/2016 | Shikoda | G06T 19/006 345/633 |

(56) References Cited

U.S. PATENT DOCUMENTS

| | | | |
|---|---|---|---|
| 2016/0080732 A1* | 3/2016 | Pedley | G06T 19/006 345/8 |
| 2016/0086242 A1* | 3/2016 | Schafer | H05B 47/155 705/26.4 |
| 2016/0171143 A1 | 6/2016 | Suiter et al. | |
| 2016/0198145 A1* | 7/2016 | Lee | G06T 7/85 348/47 |
| 2016/0210377 A1* | 7/2016 | Bumbalough | G06F 30/13 |
| 2016/0314623 A1* | 10/2016 | Coleman | G05B 19/409 |
| 2017/0017301 A1* | 1/2017 | Doornenbal | G06T 19/20 |
| 2017/0046012 A1* | 2/2017 | Han | G08B 13/19682 |
| 2017/0061039 A1* | 3/2017 | Sweeney | G06F 30/13 |
| 2017/0090680 A1* | 3/2017 | Hersche | H04L 12/282 |
| 2017/0140640 A1* | 5/2017 | Moore | G08B 25/002 |
| 2017/0200286 A1* | 7/2017 | Brahmanapalli | H04N 23/63 |
| 2017/0230930 A1* | 8/2017 | Frey | H04W 64/003 |
| 2017/0256096 A1* | 9/2017 | Faaborg | G06T 19/003 |
| 2017/0262623 A1* | 9/2017 | Plenderleith | G06F 3/04842 |
| 2017/0323062 A1* | 11/2017 | Djajadiningrat | G16Z 99/00 |
| 2017/0329402 A1* | 11/2017 | Riedel | H04N 13/337 |
| 2018/0032481 A1* | 2/2018 | Ishida | G06F 3/0485 |
| 2018/0049622 A1* | 2/2018 | Ryan | A61B 1/00048 |
| 2018/0067593 A1* | 3/2018 | Tiwari | G08B 13/22 |
| 2018/0069932 A1* | 3/2018 | Tiwari | G08B 29/18 |
| 2018/0096528 A1* | 4/2018 | Needham | G06T 7/70 |
| 2018/0102858 A1* | 4/2018 | Tiwari | G06Q 10/04 |
| 2018/0121571 A1* | 5/2018 | Tiwari | G06F 30/13 |
| 2018/0260988 A1* | 9/2018 | Huang | G06T 17/20 |
| 2018/0268087 A1* | 9/2018 | Tierney | G06F 30/13 |
| 2018/0300952 A1* | 10/2018 | Evans | G06F 9/453 |
| 2018/0318014 A1* | 11/2018 | Gangwar | G06T 7/73 |
| 2018/0336732 A1* | 11/2018 | Schuster | G06Q 10/0875 |
| 2018/0357670 A1* | 12/2018 | DeLuca | G06Q 30/0255 |
| 2018/0374276 A1* | 12/2018 | Powers | G06T 17/205 |
| 2019/0019321 A1* | 1/2019 | Thielen | G09B 5/06 |
| 2019/0087078 A1* | 3/2019 | Norton | G08B 29/145 |
| 2019/0088030 A1* | 3/2019 | Masterson | G01S 19/01 |
| 2019/0122292 A1* | 4/2019 | Riggins | G06Q 30/0643 |
| 2019/0188337 A1* | 6/2019 | Keane | G06T 17/00 |
| 2019/0193956 A1* | 6/2019 | Morland | B65G 61/00 |
| 2019/0221037 A1* | 7/2019 | Sugaya | B25J 9/1671 |
| 2019/0228581 A1* | 7/2019 | Dascola | G06T 13/20 |
| 2019/0228582 A1* | 7/2019 | Yerkes | G06F 1/1686 |
| 2019/0228588 A1* | 7/2019 | Rockel | G06F 3/0304 |
| 2019/0228589 A1* | 7/2019 | Dascola | H04M 1/72403 |
| 2019/0244436 A1* | 8/2019 | Stansell | G06T 19/20 |
| 2019/0251750 A1* | 8/2019 | Brewer | G06F 3/0346 |
| 2019/0266804 A1* | 8/2019 | Kohlhoff | G06T 13/20 |
| 2019/0282324 A1* | 9/2019 | Freeman | A61B 34/25 |
| 2019/0304188 A1* | 10/2019 | Bridgeman | G09B 5/02 |
| 2019/0325653 A1* | 10/2019 | Yip | G06F 3/04883 |
| 2019/0340825 A1* | 11/2019 | Laurent | G06T 19/20 |
| 2019/0340833 A1* | 11/2019 | Furtwangler | G06F 16/245 |
| 2019/0362564 A1* | 11/2019 | Shen | G06T 13/40 |
| 2020/0012336 A1* | 1/2020 | Orr | A61B 5/11 |
| 2020/0035122 A1* | 1/2020 | Abbott | G06T 19/20 |
| 2020/0057824 A1* | 2/2020 | Yeh | G06F 30/13 |
| 2020/0082182 A1* | 3/2020 | Lee | G06K 9/00704 |
| 2020/0082633 A1* | 3/2020 | Rom | G06T 17/10 |
| 2020/0105066 A1* | 4/2020 | Yip | G06T 19/006 |
| 2020/0111263 A1* | 4/2020 | Huang | G06Q 30/0643 |
| 2020/0111267 A1* | 4/2020 | Stauber | G06F 3/017 |
| 2020/0117335 A1* | 4/2020 | Mani | G06F 9/452 |
| 2020/0117336 A1* | 4/2020 | Mani | F25B 49/005 |
| 2020/0126291 A1* | 4/2020 | Nguyen | G06F 3/0346 |
| 2020/0126315 A1* | 4/2020 | Song | G06T 7/75 |
| 2020/0145588 A1* | 5/2020 | Kasuya | G06T 7/70 |
| 2020/0150750 A1* | 5/2020 | Suzuki | G06F 3/0488 |
| 2020/0175576 A1* | 6/2020 | Born | G06Q 50/16 |
| 2020/0175764 A1* | 6/2020 | Romea | G06T 7/73 |
| 2020/0186786 A1* | 6/2020 | Gibby | H04N 13/106 |
| 2020/0197107 A1* | 6/2020 | Ryan | G06T 19/006 |
| 2020/0210729 A1* | 7/2020 | Beaurepaire | G06V 20/584 |
| 2020/0211205 A1* | 7/2020 | LeGaye | G06T 7/251 |
| 2020/0211292 A1* | 7/2020 | Wu | G06F 30/12 |
| 2020/0226823 A1* | 7/2020 | Stachniak | G06T 19/006 |
| 2020/0258144 A1* | 8/2020 | Chaturvedi | G06T 7/50 |
| 2020/0265120 A1* | 8/2020 | Bruya | E04B 1/74 |
| 2020/0265745 A1* | 8/2020 | Buras | G06F 3/011 |
| 2020/0265754 A1* | 8/2020 | Buras | G16H 30/20 |
| 2020/0302681 A1* | 9/2020 | Totty | G06T 7/74 |
| 2020/0310732 A1* | 10/2020 | Jang | G06F 3/14 |
| 2020/0311428 A1* | 10/2020 | Rom | G06T 15/04 |
| 2020/0342660 A1* | 10/2020 | Stachniak | G06T 19/006 |
| 2020/0388177 A1* | 12/2020 | Recker | G06F 3/011 |
| 2020/0393952 A1* | 12/2020 | Hsiao | G06F 3/04847 |
| 2020/0394842 A1* | 12/2020 | Baillard | G06T 19/006 |
| 2020/0394900 A1* | 12/2020 | Lontka | G08B 29/12 |
| 2021/0073449 A1* | 3/2021 | Segev | G06N 20/00 |
| 2021/0097768 A1* | 4/2021 | Malia | G06F 3/0488 |
| 2021/0097775 A1* | 4/2021 | Zurmoehle | G06F 1/1694 |
| 2021/0200910 A1* | 7/2021 | Fernandez-Orellana | A62B 5/00 |
| 2021/0200911 A1* | 7/2021 | Chiang | G08B 17/00 |
| 2021/0201030 A1* | 7/2021 | Ju | G06V 20/20 |
| 2021/0201635 A1* | 7/2021 | Fernandez-Orellana | G08B 7/066 |
| 2021/0225502 A1 | 7/2021 | Wright et al. | |
| 2021/0233320 A1* | 7/2021 | Rom | G06F 3/017 |
| 2021/0248280 A1* | 8/2021 | Fernandez-Orellana | G06F 30/13 |
| 2021/0248281 A1* | 8/2021 | Fernandez-Orellana | G06Q 10/063 |
| 2021/0248282 A1* | 8/2021 | Fernandez-Orellana | G06F 30/13 |
| 2021/0295048 A1* | 9/2021 | Buras | A61B 8/4263 |
| 2021/0322806 A1* | 10/2021 | Fernandez-Orellana | A62C 37/00 |
| 2021/0333979 A1* | 10/2021 | Rockel | G06F 3/0482 |
| 2021/0343073 A1* | 11/2021 | Carrington | G06V 30/422 |
| 2021/0374297 A1* | 12/2021 | McDade | G06Q 30/0283 |
| 2022/0092720 A1* | 3/2022 | Henry | G01C 21/206 |
| 2022/0108236 A1* | 4/2022 | Pinho | H04W 4/33 |
| 2022/0139043 A1* | 5/2022 | Jovanovic | G06T 19/006 345/419 |
| 2022/0172469 A1* | 6/2022 | Rom | G06V 10/462 |
| 2022/0198082 A1* | 6/2022 | Bandara | G06F 30/12 |
| 2022/0198095 A1* | 6/2022 | Bandara | G06F 30/20 |
| 2022/0292240 A1* | 9/2022 | Murphy | G06N 3/0475 |
| 2022/0383600 A1* | 12/2022 | Jovanovic | G06T 19/20 |
| 2023/0035962 A1* | 2/2023 | Hashimoto | G06V 20/20 |

\* cited by examiner

METHOD FOR DETERMINING AT LEAST ONE REGION IN AT LEAST ONE INPUT MODEL FOR AT LEAST ONE ELEMENT TO BE PLACED

CROSS-REFERENCE TO RELATED APPLICATIONS

This application claims priority to European Application No. 18200985.2, having a filing date of Oct. 17, 2018, the entire contents of which are hereby incorporated by reference.

FIELD OF TECHNOLOGY

The following relates to a computer-implemented method for determining at least one region in at least one input model for at least one element to be placed. Furthermore, the following is directed toward a corresponding processing unit and computer program product. The following can in particular be classed in the technical field of building equipment.

BACKGROUND

Virtual reality (VR) is becoming increasingly important. Virtual reality designates the representation of a virtual world which is computer-generated. The virtual world can, for example, be based on the real world. Furthermore, virtual reality is closely related to VR glasses. By using VR glasses, the user is advantageously no longer dependent on the monitor but has a 3D image available and can turn his head comfortably in all directions to track the virtual world.

Through VR glasses, the user can also perceive a building plan three-dimensionally. Frequently fire detector devices or other elements to be placed must be placed in this building plan subsequently. Accordingly, it is frequently necessary to amend the building plan and extend it by an element.

According to the prior art, the installation or placement of an element to be placed in the building plan, such as, for example, fire detectors or fire detection devices, is carried out manually by a technical expert. The technical expert must however ensure in a complex and time-consuming manner that specific rules, standards, and/or boundary conditions are satisfied. For example, the fire detector must be a certain distance from a wall, etc., see further below. Conventionally the technical expert manually places the element to be placed in several runs. The rules, standards, and boundary conditions must be checked and satisfied. Then the building plan is checked and accepted by a certifying office.

SUMMARY

An aspect relates to a method for determining at least one region in at least one input model for at least one element to be placed which is more reliable and more efficient.

Embodiments of the invention include a method for determining at least one region in at least one input model for at least one element to be placed comprising the steps:
 a. receiving an input data set comprising the at least one element to be placed, a plurality of conditions; the at least one input model;
 b. determining at least one appurtenant condition from the plurality of conditions; and
 c. determining at least one valid and/or invalid region of the at least one input model depending on the appurtenant condition; wherein
 d. the at least one valid region satisfies the appurtenant condition at least in part.

Accordingly, embodiments of the invention are directed toward a method for determining at least one region of an input module for an element to be placed.

In a first step, an input data set is received. The input data set comprises at least the element to be placed, the plurality of conditions, and an input model.

The element to be placed is that element, which is placed with the aid of the method. Exemplary elements are elements of a structure, in particular a building, such as fire detectors and smoke alarms. Further other exemplary elements are sensors and actuators. This can comprise a new element or an already existing element. For example, anew element or other element can be placed for the first time or placed anew.

The conditions can also be designated as specifications. They must be taken into account when placing the element to be placed in a region of the input model. The element to be placed must only be placed in specific regions of the input model, which satisfy the conditions. In other words, the placing element cannot be placed at any location. The term placing can also be interpreted as setting up or installing. Exemplary conditions are rules and standards such as distance rules for smoke alarms or fire detectors, reachability criteria for manual alarms, visibility criteria for visual warning devices etc. With regard to the distance rules, for example, the fire detectors must be a certain distance from the wall or also sockets must be a certain distance from the floor. This distance can also be considered to be a minimum distance. Furthermore, the coverages of all the fire detectors in a room must cover the floor area of the room, etc.

The input model can be configured to be two-dimensional or three-dimensional. For example, the three-dimensional digital model is a computer-generated CAD or ifc model, in which the structure is visualized geometrically as a virtual model. The building parts are annotated semantically in the above building model. The input model can be displayed to a user, in particular by virtual reality (VR)—or augmented reality (AR)—glasses. Alternatively, other display units can be used.

In AR a superposition to the real building is visualized, whereas in VR only the virtual world is represented. VR has proved to be advantageous with regard to the planning of a new building, since no real building is provided. AR, on the other hand, can be advantageously used in existing buildings, wherein the virtual world is visually superposed on the real world.

In a second step, those one or more conditions must be selected, which can be connected to the element to be placed or can be associated with this. For example, the conditions can differ with regard to the placement region, such as according to region, country, state, canton, etc. Furthermore, the conditions can differ with regard to the building type such as office building, hospital, airport, residential house, warehouse etc. Furthermore, the conditions can differ in terms of space or room type, such as office, kitchen, washroom, store room etc. The relevant rules are selected for the element to be placed and taken into account in the next step.

In a third step, the at least one valid and/or invalid region of the input model is determined depending on the at least one appurtenant condition. In other words, the appurtenant condition is applied to the input model. The valid and invalid regions can be ascertained with reference to the appurtenant condition. The regions are in particular subregions of the input model or the basis unit. The basis unit can be the above building. The valid regions can also be designated as permissible regions, in which the element to be placed should be placed. With reference to the above example of a fire detector, the method according to embodiments of the invention determines that subregion of the building in which the fire detector satisfies the condition of minimum distance from the walls and/or further conditions.

The advantages lie in that the method according to embodiments of the invention for determining at least one region of an input model for an element to be placed and further steps of the placement is efficiently carried out automatically or independently by a processing unit. As a result, technical staff with expert knowhow and time can be saved. Furthermore, the processing unit is advantageously less error-prone and therefore more reliable. Consequently, the costs, which are incurred for example by possible later corrections can be avoided or at least considerably reduced.

Thus, existing building plans can be adapted flexibly and dynamically by the method without requiring expert knowledge or other components. The building plan can thus be extended by elements arbitrarily at any time even by non-experts since direct visual feedback relating to the conformity to the rules is given. As a result, the adaptability and reaction time to changes is improved considerably.

In one embodiment, the method further comprises displaying the at least one valid region and/or the at least one invalid region, in particular by virtual reality (VR)—or augmented reality (AR)—glasses or another display unit. Accordingly, the input model can be shown to the user, in particular by virtual reality (VR)—or augmented reality (AR)—glasses, as described further above. In addition, further data can also be displayed to the user. In addition, the determined region can be displayed to the user in color.

In a further embodiment, the method further comprises placing the at least one element to be placed in the at least one determined region of the input model; wherein the placing comprises
  performing at least one placing measure if the at least one region is a valid region; or
  outputting a placement error if the at least one region is an invalid region.

Accordingly, in the case of VR glasses, the user can determine the location or the position of the placement in the valid region through his viewing direction and perform an action or measure. In the other case of AR glasses, the actual valid region and/or the location can also be referenced by a position-determining unit.

In a further embodiment, the method further comprises displaying the placed element in the at least one valid region after performing the at least one placement measure and/or the placement error after detecting the placement error. Accordingly, the determined valid region with or without the placed element can also be displayed visually to the user. Before the placement, the display consequently displays the not-yet placed element but only after successful placement. Otherwise, after unsuccessful placement in the case of an error, the placement error can be displayed or output in some other way.

In a further embodiment, the at least one placement measure is a user command, in particular in the form of a click, a hand signal input, a speech input or a text input. Accordingly, the placement measure is accomplished by the user in the form of a command. Various input possibilities or commands are possible for this purpose. Alternatively, the processing unit can perform the placement itself without user interaction, in particular an instruction. Before the placement by the processing unit, the user can confirm the determined region or the location of the element to be placed by the processing unit.

In a further embodiment, the method further comprises adapting the at least one input model by determining or adding the position or location of the placed element and/or adapting other appurtenant data of the placed element after carrying out the at least one placement measure.

In a further embodiment, the method further comprises updating the at least one input model by means of the adapted data.

Accordingly, the input model is updated after carrying out the method according to embodiments of the invention in order to take account of the determined regions. For example, no further elements to be placed can be placed above the already-placed element or in place of these.

The embodiments further relate to a processing unit for carrying out the above method.

The embodiments further relate to a computer program product (non-transitory computer readable storage medium having instructions, which when executed by a processor, perform actions), the means for carrying out the above-described method when the computer program is executed on a program-controlled device.

A computer program product such as, for example, a computer program means, can, for example, be provided or supplied as a storage medium such as, for example, a memory card, USB stick, CD-ROM, DVD, or also in the form of a file that can be downloaded from a server in a network. This can, for example, be accomplished in a wireless communication network by the transmission of a corresponding file with the computer program product or the computer program means. In particular, a control device such as, for example, an industry control PC or a memory-programmable controller or a programmable logic controller, PLC for short, or a microprocessor for a smartcard or the like, come into consideration as a program-controlled device.

BRIEF DESCRIPTION

Some of the embodiments will be described in detail, with reference to the following figures, wherein like designations denote like members, wherein.

DETAILED DESCRIPTION

In the following, preferred embodiments of the present invention are described with reference to the figures.

Figure 1:
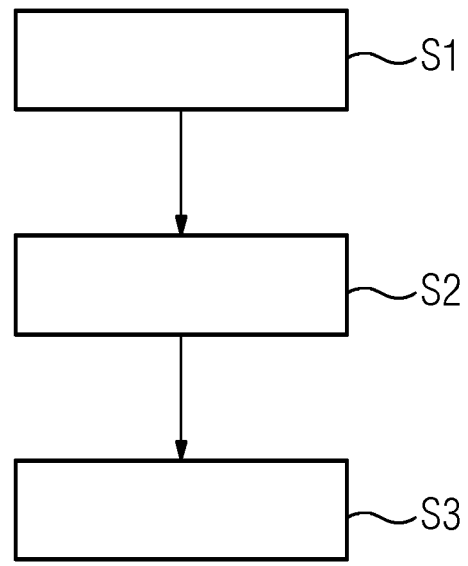
FIG. 1 shows a flow diagram according to embodiments of the invention.

FIG. 1 shows schematically a flow diagram of the method according to embodiments of the invention with the process steps S1 to S3. The individual process steps can each be carried out by the processing unit or also the subunits thereof.

A three-dimensional model of a building can be stored in the processing unit. The three-dimensional digital model can be a computer-generated CAD or ifc model in which the building parts are semantically annotated, such as for example 3D body y is a door. The three-dimensional model is designated as input model 10.

The processing unit can further be connected to one or more units such as a display unit. The display unit can display any data three-dimensionally to the user. The user can accordingly perceive the building three-dimensionally with the aid of VR glasses or AR glasses.

Furthermore, rules and/or standards 30, which must be used for placing elements 20 to be placed in the building, can be deposited in the processing unit. This can, for example, be a distance rule 30 for fire detector 20. The distance rule can be directed to the fact that fire detectors have a distance of at least 50 cm from the wall. A further rule can be directed to the fact that the coverages of the fire detectors in the room must cover the floor area of the room. The rules can differ between different administrative regions (regional, country, state, canton etc.). Furthermore, the rules can differ between various types of usage of the building (office building, hospital, airport, residential house, warehouse etc.). Inside the building the rules can also differ between different types of rooms (office, kitchen, washroom, storeroom, etc.).

In addition, the processing unit or a memory unit of the processing unit can store the data.

In the case of a representation in virtual space, VR, a virtual model of the building is produced by the processing unit, through which the user can move virtually. VR has proved particularly advantageous with regard to new builds in the early planning phase. The user can select S2 the element 20 to be placed, for example, a detector in a menu or by speech command. The appurtenant rule 30 is then determined or selected and applied to the input model 10. For example, it follows from the input model 10 that the building comprises the usage type of an airport. For the exemplary airport, there is a special set of rules 30 for placing equipment, which is determined or selected S2. Then, by reference to the appurtenant rule, the valid and invalid regions 12, 14 for placing the element 20 to be placed are determined S3. These regions 12, 14 can be displayed visually to the user, for example, the invalid regions in red and/or the valid regions in green. Alternatively, or additionally to the color, any other types of marking can be used. The user can place the element 20 to be placed by determining the location or position for the placement through his viewing direction (crosshairs or device symbol) and carrying out a placement measure (e.g. by clicking on pointing device or speech command). Alternatively, or additionally, the location or position for the placement can be determined by an additional pointing device, the position of which is referenced in space with the VR system. The device can then be displayed in the virtual surroundings and its position stored in the digital building model.

The completed placement of the placed element 20 can change the valid regions 12 for the placement of further elements. In particular, no further elements can be placed directly above the present placed element 20. The placement of further elements in the coverage range of the already placed element 20 is in particular disadvantageous with regard to economic viewpoints. Thus, the permissible and impermissible regions 12, 14 can be re-calculated and visualized with reference to the updated input model 10.

If an element 20 to be placed is placed in an impermissible region 14, this attempt at placing can be identified as an error and displayed to the user. An intentional placement can provide further steps, which can also be documented. Alternatively, or additionally, the processing unit can automatically find a new location for the element 20 to be placed, possibly optimized with regard to costs, visibility, cable length etc. This position is then displayed virtually and must merely be confirmed.

The above method is also applicable in the case of representation in mixed or augmented reality environments. AR has proved particularly advantageous with regard to the renovation of existing buildings or after the structural work phase of new buildings.

The following particular features are important here. Since the user in this case is actually on site in the building in which the element to be placed is to be placed, the regional range of validity of the appurtenant rule 30 can be determined by means of a position determining unit. Furthermore, the position of the user in the input model 10 can be ascertained by means of indoor positioning systems, for example, markers, WLAN tracking etc. Furthermore, additional obstacles can be taken into account by a scanner unit, which are not entered in the input model. The obstacles can, for example, comprise plants or furnishings etc. The position or location for placing the equipment can be displayed by a pointer element, which is visible in the real building, which can be detected by the camera unit of AR glasses or in the smartphone. The pointer element can, for example, be a laser pointer, pointing with the finger, or pointer rod.

Figure 2:
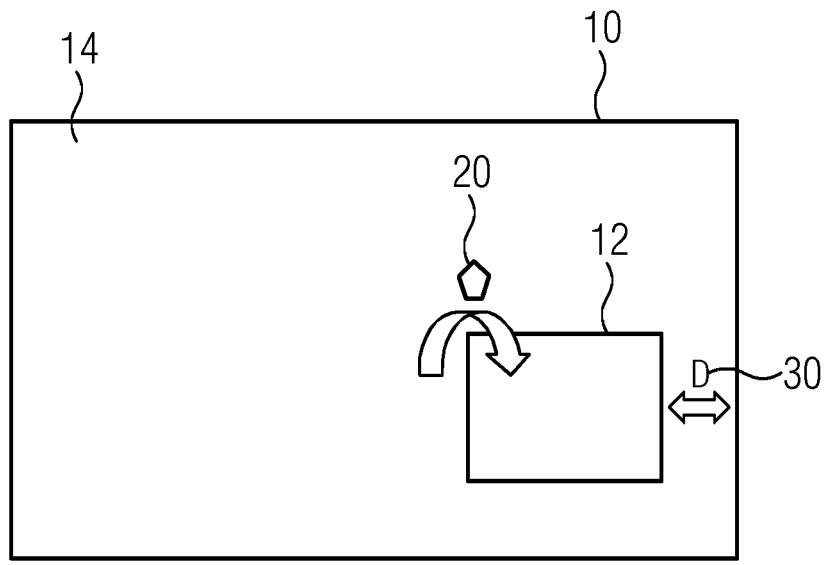
FIG. 2 shows an input model with the element to be placed before placement according to one embodiment of the invention.
Figure 3:
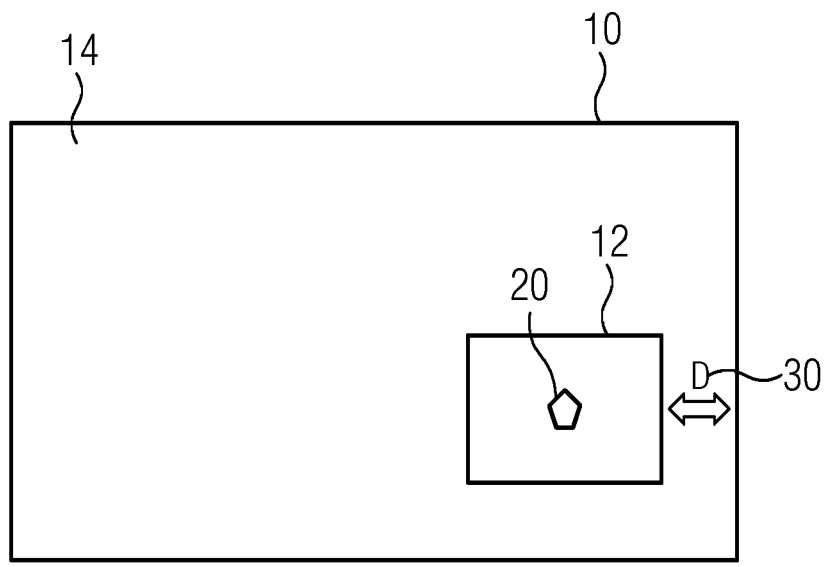
FIG. 3 shows an input model with the placed element after placement according to one embodiment of the invention.

FIGS. 2 and 3 each show an input model 10 according to one embodiment of the invention. The input model 10 has a determined valid region 12, in which the element 20 to be placed can be permissibly placed. The valid region is determined by the method according to embodiments of the invention. In this region the minimum distance D, 30 is satisfied as appurtenant condition.

FIG. 2 shows the element to be placed after process step 3 before the placement. FIG. 3, on the other hand shows the already-placed element.

Although the present invention has been disclosed in the form of preferred embodiments and variations thereon, it will be understood that numerous additional modifications and variations could be made thereto without departing from the scope of the intention.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

The invention claimed is:

1. A method for determining subregions in at least one input model for valid placement of a plurality of elements to be placed, the method comprising:
    receiving an input data set comprising the plurality of elements to be placed, at least one condition, and the at least one input model, the at least one input model being a three-dimensional model of a building, the building having one or more room environments, and the at least one condition is selected based on a geographical location or a type of room environment;
    determining at least one appurtenant condition from the at least one condition, wherein the at least one appurtenant condition is based on at least one rule or standard that differ with regard to the geographical location of the building and the type of room environment of the building;
    receiving a selection of a first element to be placed;
    determining valid subregions and invalid subregions of the at least one input model by applying the at least one appurtenant condition to the at least one input model based on the first element to be placed;

displaying the valid subregions and the invalid subregions in response to receiving the selection of the first element to be placed, without requiring the first element to be placed within the at least one input model, such that there are at least two valid subregions to place the first element;

performing a first placement measure if the first element is placed in a subregion that is one of the valid subregions;

changing a display of the subregion from a valid region to one of the invalid subregions for placement of a second element, in response to the first placement measure;

updating the at least one input model in response to the performing the first placement measure, wherein the updating includes adapting the at least one input model by adding a position or location of the placed first element after carrying out the first placement measure to prevent the second element from being placed proximate the first element;

receiving a selection of the second element to be placed;

displaying the valid subregions and the invalid subregions in response to receiving the selection of the second element to be placed, without requiring the second element to be placed within the at least one input model, such that less valid subregions and more invalid regions are displayed due to the updating; and performing a second placement measure if the second element is placed in a remaining valid subregion;

wherein the valid subregions each satisfy the appurtenant condition at least in part.

2. The method as claimed in claim 1, wherein the valid subregions and the invalid subregions are displayed by a virtual reality or augmented reality glasses or another display unit.

3. The method as claimed in claim 1, further comprising outputting a placement error if the subregion is one of the invalid regions.

4. The method as claimed in claim 3, further comprising displaying the placed first element.

5. The method as claimed in claim 1, wherein the placement measure is a user command, the user command being at least one of a click, a hand signal input, a speech input, and a text input.

6. The method as claimed in claim 1, wherein the updating further comprising adapting other appurtenant data of the placed first element after carrying out the placement measure.

7. The method of claim 1, wherein the plurality of elements to be placed are elements of the room environment.

8. The method of claim 7, wherein the elements of the room environment include elements of a structure, fire detectors, smoke alarms, sensors, manual alarms, visibility criteria for visual warning devices, and actuators.

9. The method of claim 1, wherein, if the first element is placed in a subregion that is not one of the valid subregions, automatically finding a new location for the first element to be placed and displaying the new location.

10. The method of claim 1, wherein, if the second element is placed in a subregion that is not one of the valid subregions, automatically finding a new location for the second element to be placed and displaying the new location.

11. The method of claim 1, wherein the first element and the second element are a same type of object.

12. The method of claim 1, wherein a plurality of elements of the same type are configured to be placed within the at least one input model of the building having one or more room environments.

13. A computing system for carrying out the method as claimed in claim 1.

14. A computer program product, comprising a computer readable hardware storage device having computer readable program code stored therein, said program code executable by a processor of a computer system to implement a method as claimed in claim 1 when the computer program is executed on a program-controlled device.

* * * * *